United States Patent [19]
Harrison

[11] 4,429,238
[45] Jan. 31, 1984

[54] STRUCTURED LOGIC ARRAY

[75] Inventor: Marc L. Harrison, Morganville, N.J.

[73] Assignee: Bell Telephone Laboratories, Incorporated, Murray Hill, N.J.

[21] Appl. No.: 292,840

[22] Filed: Aug. 14, 1981

[51] Int. Cl.³ ............... H03K 19/173; H03K 19/177; G06F 9/00

[52] U.S. Cl. ................................ 307/465; 307/463; 307/468; 364/716

[58] Field of Search .............. 307/463, 465, 468, 469, 307/471; 364/716

[56] References Cited

U.S. PATENT DOCUMENTS

| | | | |
|---|---|---|---|
| 3,943,377 | 3/1976 | Suzuki | 307/469 X |
| 4,032,894 | 6/1977 | Williams | 307/468 X |
| 4,084,152 | 4/1978 | Long et al. | 364/716 X |
| 4,123,669 | 10/1978 | Devine et al. | 307/468 X |
| 4,208,728 | 6/1980 | Blahut et al. | 307/469 X |
| 4,233,667 | 11/1980 | Devine et al. | 307/465 X |

OTHER PUBLICATIONS

Brickman et al., "Programmable Logic Array Logic Enhancement", *IBM Tech. Discl. Bull.,* vol. 19, No. 2, p. 583, 7/1976.

Grice et al., "Exclusive OR PLA AND Array"; *IBM Tech. Discl. Bull.;* vol. 23, No. 7B; pp. 3270-3271; 12/1980.

*Primary Examiner*—Larry N. Anagnos
*Attorney, Agent, or Firm*—David I. Caplan

[57] ABSTRACT

The present invention is a programmed logic array (PLA) which implements IF, THEN, ELSE, or CASE statements. This is accomplished through the use of combinatorial logic located between the DECODER and ROM arrays of the PLA.

7 Claims, 4 Drawing Figures

STRUCTURED LOGIC ARRAY

FIELD OF THE INVENTION

This invention relates to programmed logic arrays (PLAs).

BACKGROUND OF THE INVENTION

Programmed logic arrays (PLAs) provide an easily designed and well structured alternative to combinatorial logic.

Internally, a conventional prior art PLA comprises two logic arrays known as the DECODER array and the ROM array. The two arrays are electrically connected by paths known as wordlines. Each wordline corresponds to one minterm of the Boolean functions implemented by the PLA. PLA input signals are entered into the DECODER array on a plurality of input lines and PLA output signals emanate from the ROM array on a plurality of output lines.

A PLA is in many ways similar to a Read-Only-Memory (ROM). As black boxes, both are presented with a binary input word and in response both output a predefined binary word. The most significant difference between a PLA and a ROM is that in the former every possible combination of binary input signals (of which there are $2^N$ for N PLA input lines) is not presented. A typical PLA produces a meaningful output only in response to certain preselected combinations of binary input signals. These preselected combinations generally number less than $2^N$ for a PLA having N inputs. If a given one of the preselected combinations of binary input signals is present on the PLA input lines, then a given preselected combination of binary output signals emanates from the PLA. If the combination of binary input signals present on the PLA input lines does not correspond to a given one of the preselected combinations of binary input signals, the PLA may not produce a meaningful output. In contrast, a ROM having N input lines will always produce a unique binary output for each of the $2^N$ unique combinations of binary input signals. As a result, for the same technology of fabrication the PLA is generally smaller and faster than the ROM which would be required to replace it, assuming implementation of the same Boolean functions.

When specifying Boolean functions to be implemented in hardware, it is often the case that there are combinations of input signals that contain don't cares. That is, one or more of the input signals are not needed to uniquely determine the output. When designing with conventional combinatorial and sequential logic which includes gates and registers, there are many optimization techniques, such as Karnaugh mapping, that take advantage of these don't cares to reduce logic complexity. When replacing conventional combinatorial logic with ROM, there is no way to make use of this savings because a unique output pattern will exist for every one of the $2^N$ combinations of input signals that can be entered into a ROM having N binary input lines. However, a PLA differs from a ROM in that don't cares are taken advantage of and a savings accrues. Preselected combinations of binary PLA input signals may be incompletely specified, or fully specified, as the designer sees fit.

To further understand the type of function which can be implemented with a conventional PLA, it is useful to consider an illustrative PLA which has four input lines, three output lines and two wordlines (corresonding to two Boolean minterms), and which implements the following Boolean function:

| | | |
|---|---|---|
| IF | (input 1 = 1 AND | |
| | input 2 = 0 AND | |
| | input 3 = 1 AND | |
| | input 4 = X) | (X is a don't care which can be zero or one) |
| THEN | (output 1 = 1 | |
| | output 2 = 1 | |
| | output 3 = 0) | |
| OR | | |
| IF | (input 1 = 1 AND | |
| | input 2 = X AND | |
| | input 3 = 1 AND | |
| | input 4 = 1) | (X is a don't care which can be zero or one) |
| THEN | (output 1 = 1 | |
| | output 2 = 0 | |
| | output 3 = 0) | |

A conventional prior art PLA which implements this Boolean function is illustrated in FIG. 1. In the above-mentioned PLA example, if either of the preselected combinations of binary input signals is present on the PLA input lines, the corresponding combination of binary PLA output signals results. (Note, that in the above-mentioned PLA example, the use of don't cares indicates that the preselected combinations of binary input signals are incompletely specified.) If the combination of binary signals present on the PLA input lines does not correspond to either of the preselected combinations of binary input signals, no meaningful PLA output results.

Thus, as can be seen from the above-mentioned Boolean function, the conventional PLA should be viewed by the designer as implementing a series of IF, THEN statements. This can be understood by considering the internal operation of the PLA as shown in FIG. 1. This PLA has two wordlines connecting the ROM and DECODER arrays. There is one wordline corresponding to each incompletely specified preselected combination of input signals. There is no ELSE construct which can be used to produce a meaningful PLA output if neither of the two (101X and 1X11) preselected combination of PLA input signals is present on the PLA input lines.

Providing a true ELSE construct would allow one to design a PLA capable of implementing functions similar to the IF, THEN, or ELSE, i.e., CASE statements of a high-level computer language. A CASE statement is thus a series of IF, THENs followed by an ELSE. A PLA which implements a CASE statement should be able to produce a meaningful Boolean output to indicate that none of a plurality of preselected combinations of binary input signals is present on the PLA input lines. In other words, IF one of the plurality of preselected combinations of binary input signals is present on the PLA input lines, THEN the corresponding PLA output results, ELSE an output, indicating the simultaneous absence of all of the plurality of preselected combinations of binary input signals, results.

Availability of a PLA able to implement CASE statements would be especially useful in the design of microprogrammable microprocessor control structures. Accordingly, efforts have been directed to the development of a PLA adapted to implement IF, THEN, or ELSE, i.e., CASE type statements.

SUMMARY OF THE INVENTION

The present invention is a programmed logic array able to implement IF, THEN, or ELSE, i.e., CASE statements. This is accomplished through the use of combinatorial logic located between the DECODER and ROM arrays of the PLA.

In a particular embodiment of the invention, a PLA, for processing binary input signals to produce binary output signals, comprises: a first logic array (DECODER) having a plurality of input lines for receiving the binary input signals; a second logic array (ROM) having a plurality of output lines on which the binary output signals emanate; a first plurality of wordlines which emanate from the first array, the binary signal on each of the first plurality of worklines being responsive to a preselected combination of the binary input signals; a second plurality of wordlines which enter the second logic array; and combinatorial logic for processing binary signals emanating from the first array on the first plurality of wordlines before these binary signals enter the second array on the second plurality of wordlines so that the PLA implements a CASE statement. Illustratively, the CASE statement is implemented by using combinatorial logic element, such as a multiple input NOR gate to form at least one additional wordline in the second plurality of wordlines which can be used to produce a prescribed PLA output if none of a preselected plurality of combinations of binary input signals is present.

In an alternative embodiment of the invention, the plurality of PLA input lines comprises a plurality of mutually exclusive groups and the combinatorial logic is adapted so that the PLA implements a CASE statement for combinations of input signals present on at least one of the groups of input lines. Illustratively, the plurality of PLA input lines comprises two mutually exclusive groups and the combinatorial logic is adapted such that the PLA implements a CASE statement for combinations of input signals present on the second group of input lines only when a preselected combination of input signals is present on the first group of input lines. Alternatively a CASE statement can be implemented for combinations of input signals present on the second group of input lines only when a preselected combination of input signals is not present on the first group of input lines.

Use of the structures encompassed within the scope of the present invention gives rise to various advantages in the design of microprogrammable microprocessor controllers. Firstly, a relatively complex Boolean function can be implemented at the expense of a relatively small amount of design time. Secondly, the present invention can be used to implement relatively complex Boolean functions with relatively small PLA's. For example, suppose in a large group of OP CODES or program instructions to be interpreted by a PLA controller, a specified plurality (e.g., ten) of mutually exclusive OP CODES (no common don't cares) result in the same specified PLA output. A conventional PLA might require one wordline for each of the specified plurality of OP CODES resulting in the same PLA output (e.g. ten wordlines) in addition to separate wordlines for each other OP CODE. A PLA designed in accordance with the principles of the present invention would be expected to eliminate all (ten) of the wordlines corresponding to the specified plurality of OP CODES but would contain separate wordlines for each of the other OP CODES. The inventive PLA would produce the specified output corresponding to the specified plurality of (ten) OP CODES through use of an ELSE construct which implicitly indicates the presence of one of the specified plurality of (ten) OP CODES, by explicitly indicating that all of the other OP CODES are not present.

DETAILED DESCRIPTION

In order to understand the principles of the present invention, it is helpful to briefly review the operation of the conventional prior art PLA which, as previously indicated, implements statements of the IF, THEN type. An example of such a PLA is shown in FIG. 1.

Figure 1:
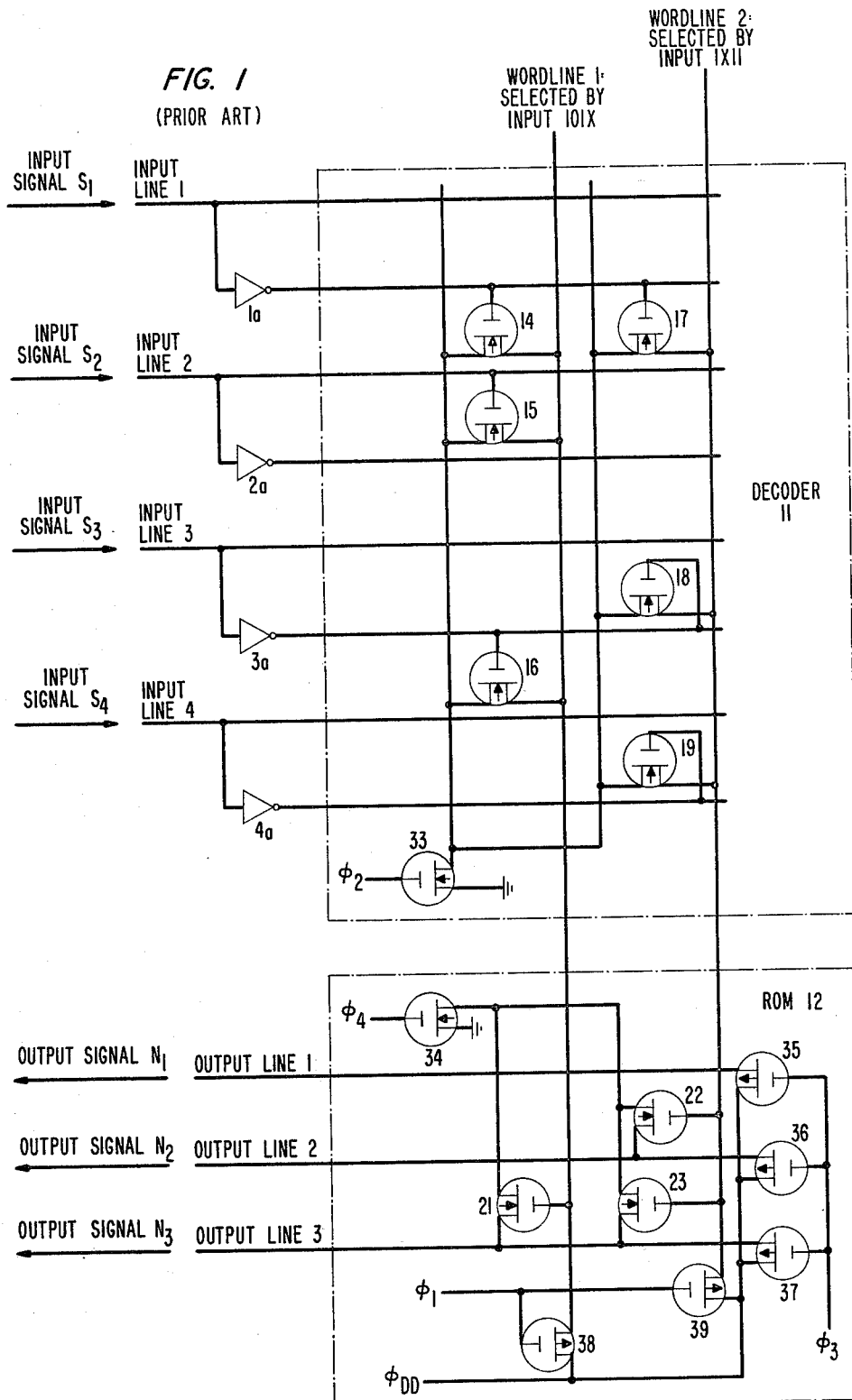
FIG. 1 shows a standard PLA of the type found in the prior art.

The PLA of FIG. 1 is composed of two logic arrays, DECODER array 11 and ROM array 12. Binary PLA input signals $S_1$, $S_2$, $S_3$, and $S_4$, in their true and complementary forms, are fed into the decoder array on input lines 1, 2, 3, and 4. Input inversion is provided by inverters 1a, 2a, 3a, and 4a, for the illustrative PLA shown in FIG. 1. PLA output signals $N_1$, $N_2$, and $N_3$ emanate from the ROM array on output lines 1, 2, and 3. Between the two logic arrays run wordlines, two of which (wordline 1 and wordline 2) are shown for purposes of illustration in FIG. 1. Each wordline represents one minterm of the Boolean function implemented by the PLA.

The PLA shown in FIG. 1 is a dynamic structure. That is, it relies on its own intrinsic capacitance for proper operation. Any dynamic logic structure requires a period of time to precharge itself. During the precharge time, a capacitative charge is accumulated which causes and maintains a voltage level within elements of the array. After this follows a period of time during which charges are selectively held or dissipated. This selection process is based upon the input signals which enter the structure. Note that in FIG. 1 the DECODER and ROM arrays are formed using n-channel transistors (indicated by inward pointing arrow) and that the PLA uses negative logic.

The operation of the illustrative PLA shown in FIG. 1 can be understood as follows. Wordlines 1 and 2 are precharged through p-type transistors 38 and 39, respectively (p-channel transistors are indicated by an outward pointing arrow), by voltage $\phi_{DD}$ on phase $\phi_1$ of a four phase clock cycle and are discharged to ground through n-channel transistor 33 which is operative on phase $\phi_2$ of the four phase clock cycle. A precharged (logic HI) wordline is deselected when it is discharged (logic LOW) by any one of the intersecting n-channel transistors (e.g., transistor 14 of array 11) in the DECODER array, each of which is responsive to a particular input signal. Transistors are placed in the DECODER array so that their locations correspond to the presence of the complement of each desired input signal (negative logic). Therefore, if any one of the desired input signals is false, the wordline will be discharged (logic LOW). Only if all of the desired input signals are true will the wordline remain precharged (logic HI), thereby selecting the Boolean minterm represented by the wordline. In the illustrative example of FIG. 1, wordline 1 remains precharged if the input combination is 101x where x is a don't care, and wordline 2 remains precharged if the input combination is 1×00 where x is a don't care. Accordingly, transistors 14, 15, and 16 can discharge wordline 1, and transistors 17, 18, and 19 can discharge wordline 2.

The wordlines are then used to select or deselect the output lines, each of which has also been precharged. In FIG. 1 output lines 1, 2, and 3 are precharged through p-channel transistors 35, 36 and 37, respectively, by voltage $\phi_{DD}$ during phase $\phi_3$ of the four phase clock cycle and are discharged to ground through n-channel transistor 34 which is operative on phase $\phi_4$ of the four phase clock cycle. Where it is desired that an output signal be zero for the presence of a given minterm, an n-channel transistor (e.g., 21 of array 12) is placed in the ROM array. If the output signal is to be a one for the presence of a given minterm, the transistor is omitted in the ROM array. Thus, the selected wordlines, which themselves remain precharged (logic HI), selectively enable the transistors which discharge the output lines, resulting in an output signal of zero. On the other hand, if the wordline is discharged (logic LOW) or there is no transistor in the ROM array, the output line remains precharged resulting in an output signal of one. Thus, in the PLA of FIG. 1, if wordline 1 remains precharged transistor 21 discharges output line 3 so that the output is 110. Similarly, if wordline 2 remains precharged transistors 22 and 23 discharge output lines 2 and 3, respectively, so that the output is 100.

The range of Boolean functions which can be implemented using a conventional PLA can be expanded by altering the meaning of the wordlines by adding inverters in their paths between the DECODER array and ROM array. (See R. R. Williams U.S. Pat. No. 4,032,894 issued on June 28, 1977.)

Figure 2:
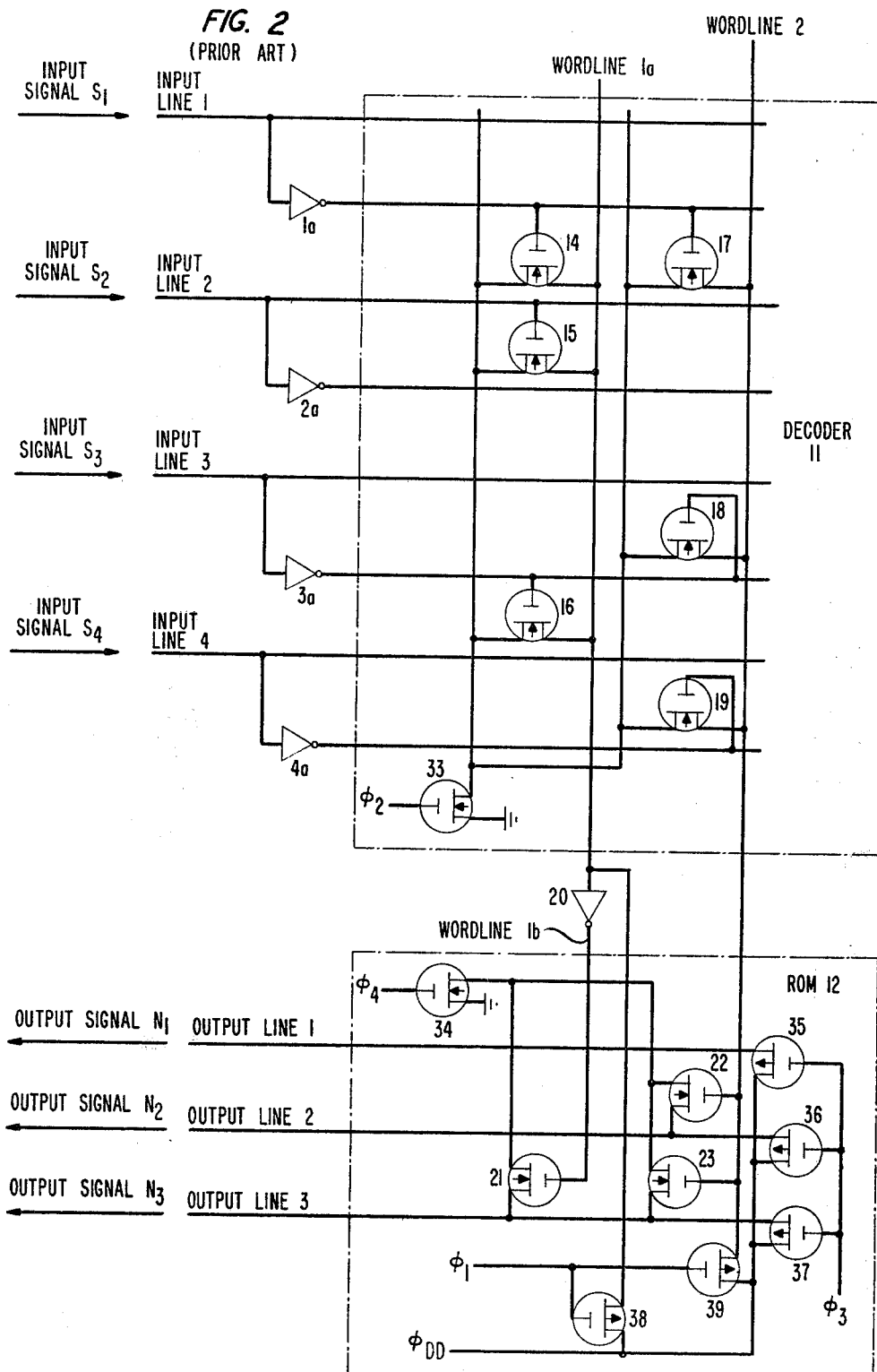
FIG. 2 shows a prior art PLA having an inverter between the DECODER and ROM arrays of the PLA in order to expand the range of functions implementable by the PLA.

An example of a PLA which includes an inverter to alter the meaning of a wordline is shown in FIG. 2. Common elements in FIGS. 1 and 2 have the same identifying names and numerals. The PLA of FIG. 2 includes inverter 20 to process the binary signal emanating from DECODER array 11 on DECODER wordline 1a before the binary signal enters ROM array 12 on ROM wordline 1b. Thus in FIG. 1, wordline 1 remains precharged (logic HI) when the combination of input signals is 101x. The inclusion of inverter 20 in FIG. 2 means that in the PLA of FIG. 2 ROM wordline 1b is deselected (logic LOW) by input signal combination 101x and selected (logic HI) by the absence of input signal combination 101x. Note also that in contrast to the PLA of FIG. 1, p-channel transistor 38 of FIG. 2, which is a precharging transistor, precharges DECODER wordline 1a of FIG. 2.

In a particular embodiment of the present invention combinatorial logic is placed between the DECODER array and the ROM array of a PLA in order to implement IF, THEN, ELSE or CASE statements.

Figure 3:
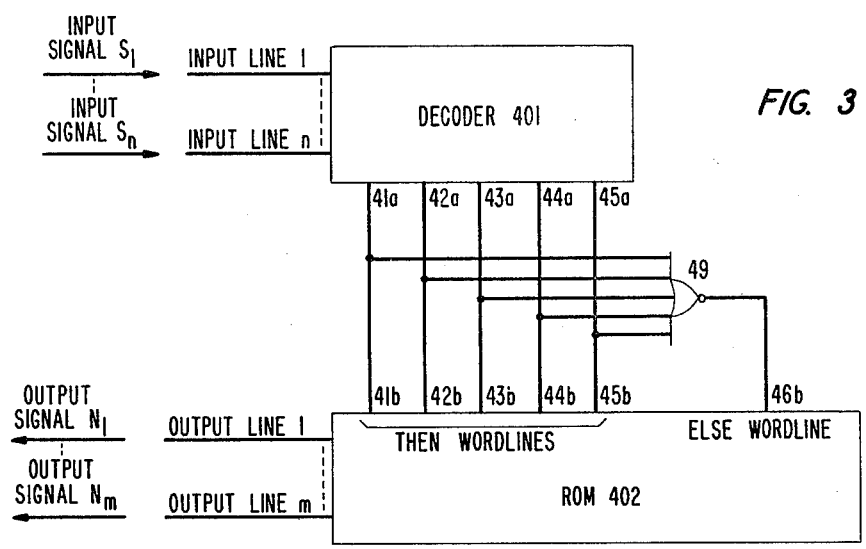
FIG. 3 shows in block schematic form a PLA having logic between the DECODER and ROM arrays of the PLA in order to implement a CASE statement, in accordance with illustrative embodiments of the invention.

As an example of the invention, FIG. 3 schematically shows a PLA which implements a CASE statement. The PLA of FIG. 3 comprises a first logic array 401 (DECODER) and a second logic array 402 (ROM). Illustratively, the arrays of FIG. 3 are formed using the same type of logic as the arrays of FIGS. 1 and 2. PLA binary input signals $S_1$ through $S_n$ enter array 401 on input lines 1 through n (where n is an integer), and PLA binary output signals $N_1$ through $N_m$ emanate from array 402 on output lines 1 through m. Binary signals emanate from array 401 on first plurality of wordlines 41a through 45a. Binary signals enter array 402 on second plurality of wordlines 41b through 46b. In this embodiment, lines 41b through 45b are identical with lines 41a through 45a, respectively, but in some instances it is feasible to interpose combinatorial logic elements between the two sets of lines. In addition, there is provided an additional wordline 46b which emanates from multiple input NOR gate 49.

Wordlines 41b through 45b implement statements of the IF, THEN type. If the PLA of FIG. 3 is implemented using logic of the type shown in FIGS. 1 and 2, each of wordlines 41b through 45b remains precharged (logic HI) for a given preselected combination of input signals and each is discharged (logic LOW) if a combination of input signals other than the given preselected combination of input signals is present, thereby implementing the IF, THEN, portion of the CASE statement. Thus, wordlines 41b–45b are labeled THEN wordlines in FIG. 3. If a given combination of input signals does not correspond to any of the preselected combinations of input signals associated with wordlines 41b through 45b, all are discharged. In this case all of the input signals to multiple input NOR gate 49 are logic LOW and wordline 46b is selected (logic HI), thereby resulting in a unique combination of PLA output signals corresponding to the selection of wordline 46b. This successfully implements the ELSE portion of the CASE statement. Thus, additional wordline 46b is labeled an "ELSE" wordline in FIG. 3.

In many control applications it is desirable to have a PLA which implements a CASE statement for a series of combinations of input signals known as test conditions only if another, mutually exclusive, combination of input signals known as the state is also present. Such a Boolean function is implemented by the PLA schematically illustrated in FIG. 4, in accordance with another illustrative embodiment of the invention.

Figure 4:
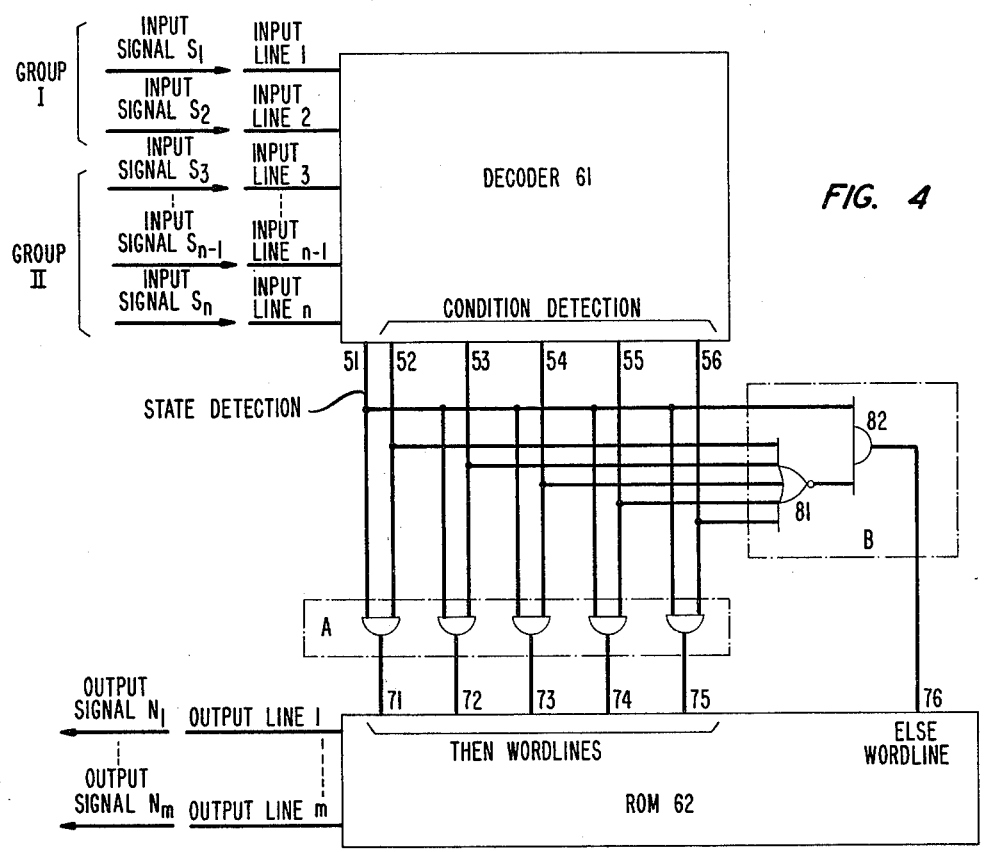
FIG. 4 shows in block schematic form a PLA having logic between the DECODER and ROM arrays in order to implement an alternative type of IF, THEN, ELSE statement in accordance with an alternative illustrative embodiment of the invention.

The PLA of FIG. 4 compises DECODER array 61 and ROM array 62. Illustratively, the arrays of FIG. 4 are formed using the same type of logic as the arrays of FIGS. 1 and 2. In the PLA of FIG. 4, input signals $S_1$ through $S_n$ enter array 61 on input lines 1 through n. Output signals $N_1$ through $N_m$ emanate from array 62 on output lines 1 through m. DECODER wordlines 51 through 56 emanate from DECODER array 61 and ROM wordlines 71 through 76 enter ROM 62. Combinatorial logic A and B of FIG. 4 is adapted to process binary signals which emanate from the DECODER array on wordlines 51–56 before entering the ROM array on wordlines 71–76. The signal on DECODER wordline 51 responds when a preselected combination of binary input signals known as the state is present on a first group of PLA input lines (e.g., Group I of FIG. 4). The signals on wordlines 52–56 each respond to the presence, on a second group of PLA input lines (e.g., Group II of FIG. 4), of a given preselected combination of binary input signals known as a test condition. Note that in the illustrative embodiment of the invention shown in FIG. 4 the two groups of input lines are mutually exclusive. Through the use of combinatorial logic A, which illustratively comprises AND gates, each of ROM wordlines 71 through 75 responds to the presence of the state and a given one of the test conditions. If the state is present and none of the test conditions are present, combinatorial logic B, which comprises multiple input NOR gate 81 and AND gate 82, causes the signal on ROM wordline 76 to respond, thereby implementing a single ELSE. Note, in the illustrative embodiment of the invention shown in FIG. 4 the presence of the state is detected in all cases which result in a meaningful PLA output. Thus the illustrative PLA shown in FIG. 4 implements a CASE statement for the test conditions only if the state is present. That is, if the state is present, wordlines 71–75 implement a series of IF, THENS for the test conditions and wordline 76 implements an ELSE. In an alternative embodiment of the invention, an inverter can be placed on wordline 51 of FIG. 4 in order to implement a CASE statement for the test conditions if the state is absent.

The illustrative embodiment of the invention shown in FIG. 4 can be viewed from another point of view. The binary signal on each of wordlines 71 through 76 is dependent on the binary signal on at least two of wordlines 51 through 56. Thus, for example, the binary signal on wordline 71 is dependent in a first way on the binary signals on wordlines 51 and 52; and the binary signal on wordline 76 is dependent in a second way on the binary signals on wordlines 51 and 52 in addition to being dependent on the binary signals on wordlines 53 through 56. Thus, in FIG. 4, the signal on wordline 71 is LOGIC HI if the signal on wordlines 51 and 52 are both LOGIC HI, and the signal on wordline 76 is LOGIC HI if the signal on wordline 51 is LOGIC HI and the signals on wordlines 52–56 are LOGIC LOW.

Finally, it is to be understood that the above-described structures and arrangements are only illustrative of the present invention. In accordance with these principles, numerous structural configurations may be devised by those skilled in the art without departing from the spirit and scope of the invention. For example, the same test condition can be combined with a plurality of different states and the presence or absence of these combinations can be detected.

Furthermore, PLAs implementing Boolean functions in accordance with the principles of the present invention can be formed from psuedo NMOS logic as shown in FIGS. 1 and 2 or from other types of logic such as TTL, CMOS, and ECL.

What is claimed is:

1. A programmed logic array for processing binary input signals to produce binary output signals comprising:

a first logic array having a plurality of input lines for receiving said binary input signals;

a second logic array having a plurality of output lines on which said binary output signals emanate;

a first plurality of wordlines, including CONDITION DETECTION wordlines, which emanate from said first array;

a second plurality of wordlines, including THEN wordlines and an ELSE wordline, which enter into said second array; and combinatorial logic for receiving binary signals emanating from said first array on said first plurality of wordlines before said binary signals emanating from said first array enter said second array on said second plurality of wordlines, and for delivering to the ELSE wordline a signal of predetermined first binary level only if the signals on all the CONDITION DETECTION wordlines are of a predetermined second binary level so that said programmed logic array implements a CASE statement.

2. The programmed logic array of claim 1 wherein said plurality of input lines comprises a plurality of mutually exclusive groups, said first plurality of wordlines further includes a STATE DETECTION wordline, and said combinatorial logic is a logic device which delivers to the ELSE wordline the signal of the first binary level only if the signals on all the CONDITION DETECTION wordlines are of the predetermined second level while the signal on the STATE DETECTION wordline of the first plurality of wordlines is of a prescribed binary level, so that said programmed logic array implements a CASE statement for combinations of input signals present on at least one of said groups of input lines.

3. The programmed logic array of claim 1 wherein said plurality of input lines comprises first and second mutually exclusive groups, and said first plurality of wordlines further include a STATE DETECTION wordline, the second group's signals determining the signals on the CONDITION DETECTION wordlines, the first group's signals determining the signal on the STATE DETECTION wordline, and said combinatorial logic is a device which delivers to the ELSE wordline the signal of the first binary level if the signals on all the CONDITION DETECTION wordlines are of the second binary level while the signal on the STATE DETECTION wordline is of a prescribed level, whereby said programmed logic array implements a CASE statement for combinations of input signals present on said second group of input lines only when a preselected combination of input signals is present on said first group of input lines.

4. The programmed logic array of claim 1 wherein said plurality of input lines comprises first and second mutually exclusive groups, and said first plurality of wordlines further includes a STATE DETECTION wordline, the second group's signals determining the signals on the CONDITION DETECTION wordlines, the first group's signals determining the signal on the STATE DETECTION wordline of the first plurality of wordlines, and said combinatorial logic is a device which delivers to the ELSE wordline the signal of the first binary level if the signals on all the CONDITION DETECTION wordlines are of the second binary level while the signal on the STATE DETECTION wordline is of a prescribed level, whereby said programmed logic array implements a CASE statement for combinations of input signals present on said second group of input lines only when a preselected combination of input signals is not present on said first group of input lines.

5. A programmed logic array for processing binary inputs on two groups of input lines to produce binary outputs comprising:

a DECODER array adapted to receive said binary inputs;

a ROM array adapted from which said binary outputs emanate;

a first plurality of DECODER wordlines which emanate from said DECODER array;

a second plurality of ROM wordlines which enter said ROM array; and combinatorial logic connected to receive binary signals emanating from said DECODER array on said DECODER wordlines before said binary signals emanating from said DECODER array enter said ROM array on said ROM wordlines and to deliver on a preselected one of the second plurality of ROM wordlines a binary signal of prescribed level in response to the presence of a combination of said input signals comprising a first preselected combination on one group of input lines and one of a plurality of second preselected combinations on the other group of input lines.

6. A programmed logic array for processing binary input signals to produce binary output signals comprising:

a first logic array adapted to receive said binary input signals;

a second logic array from which said binary output signals emanate;

a first plurality of wordlines which emanate from said first array, the binary signal on each of said first plurality of wordlines being responsive to a preselected combination of said binary input signals;

a second plurality of wordlines which enter said second array; and multiple input combinatorial logic for receiving a multiplicity of binary signals emanating from said first array on said first plurality of wordlines before said signals emanating from said first array enter said second array on said second plurality of wordlines and for delivering binary signals to the second plurality of wordlines;

the combinational logic being such that the signals delivered by said logic to first and second wordlines, respectively, of the second plurality is determined by the signals on both a first and a second wordline of the first plurality in accordance with differing first and second combinatorial logic functions, respectively.

7. Apparatus including a programmed logic array for processing binary input signals to produce binary output signals comprising:

a first logic array having a plurality of input lines for receiving said binary input signals, said input lines comprising first and second mutually exclusive groups of input lines;

a second logic array having a plurality of output lines on which the binary output signals emanate;

a first plurality of intermediate wordlines which emanate from the first array;

a second plurality of wordlines, operably connected to the first plurality of intermediate wordlines, which enter into the second array, said second plurality including a third plurality of THEN wordlines and an ELSE wordline; and a combinatorial logic element responsive to binary signals emanating from the first logic array on the first plurality of wordlines which delivers to the ELSE wordline a signal of a predetermined first level if and only if one of a first preselected set of combinations of input signals is not present on the first group of input lines when and only when any one of a second set of combinations of input signals is present on the second group of input lines.

* * * * *

UNITED STATES PATENT AND TRADEMARK OFFICE
CERTIFICATE OF CORRECTION

PATENT NO. : 4,429,238

DATED : January 31, 1984

INVENTOR(S) : Marc L. Harrison

It is certified that error appears in the above-identified patent and that said Letters Patent is hereby corrected as shown below:

Column 1, line 68, "corresonding" should read --corresponding--. Column 3, line 18, "worklines" should read --wordlines--.

Signed and Sealed this

Eighth Day of May 1984

[SEAL]

Attest:

GERALD J. MOSSINGHOFF

Attesting Officer

Commissioner of Patents and Trademarks